United States Patent
Wang

(10) Patent No.: US 8,505,183 B2
(45) Date of Patent: Aug. 13, 2013

(54) METHOD FOR SEALING EDGES OF VAPOR CHAMBER

(75) Inventor: Chin-Wen Wang, Pingzhen (TW)

(73) Assignees: Chin-Wen Wang, Taoyuan County (TW); Leader Trend Technology Corp., Taoyuan County (TW)

(*) Notice: Subject to any disclaimer, the term of this patent is extended or adjusted under 35 U.S.C. 154(b) by 351 days.

(21) Appl. No.: 12/981,422

(22) Filed: Dec. 29, 2010

(65) Prior Publication Data
US 2011/0192004 A1    Aug. 11, 2011

(30) Foreign Application Priority Data
Feb. 11, 2010    (TW) ................................ 99104405 A

(51) Int. Cl.
*B21D 39/03*    (2006.01)
(52) U.S. Cl.
USPC ........................................ 29/428; 29/890.038
(58) Field of Classification Search
USPC ............................................ 29/428, 890.038
See application file for complete search history.

(56) References Cited

U.S. PATENT DOCUMENTS

| | | | | |
|---|---|---|---|---|
| 4,258,859 A | * | 3/1981 | Westphal | 220/270 |
| 5,692,633 A | * | 12/1997 | Gordon | 220/253 |
| 2009/0040726 A1 | * | 2/2009 | Hoffman et al. | 361/700 |

* cited by examiner

*Primary Examiner* — Carl Arbes
(74) *Attorney, Agent, or Firm* — Chun-Ming Shih; HDLS IPR Services

(57) ABSTRACT

A method for sealing edges of a vapor chamber includes steps of: providing a first cover and a second cover, the first cover having its periphery bent to form a first folded edge, the second cover having its periphery bent to form a second folded edge; providing a supporting structure and a wick structure between the first cover and the second cover; covering the second cover on the first cover with the second folded edge being superposed on the first folded edge; bending the first folded edge to cover on the second folded edge; and providing a pressing die to press the first folded edge, thereby tightly connecting the first folded edge to the second folded edge. In this way, excellent tightness of sealing edges of the vapor chamber is achieved. Further, the production yield of the vapor chamber is increased with a reduced cost.

10 Claims, 8 Drawing Sheets

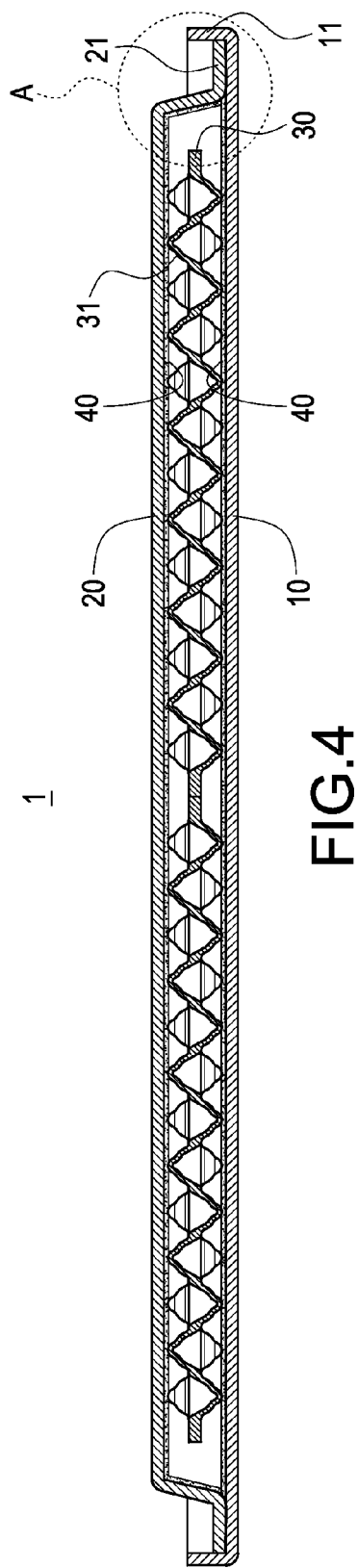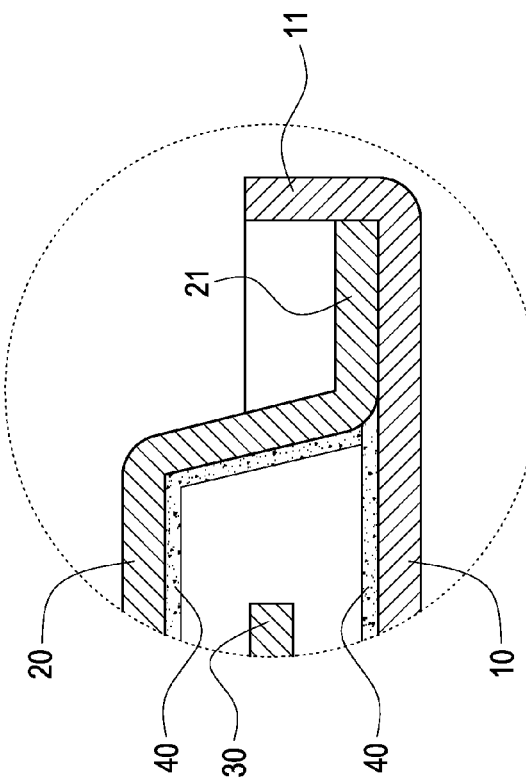

METHOD FOR SEALING EDGES OF VAPOR CHAMBER

BACKGROUND OF THE INVENTION

1. Field of the Invention

The present invention relates to a vapor chamber, and in particular to a method for sealing edge of a vapor chamber.

2. Description of Prior Art

The conventional vapor chamber includes a hollow plate, a wick structure provided in the hollow plate, and a sealing pipe in communication with the interior of the hollow plate. The hollow plate is constituted of two separate covers. The periphery of each of the two covers is a sealing edge. The two covers cover to each other and the wick structure is provided on inner walls of the two covers. Then, the sealing edges are sealed by a sealing process. A pipe is inserted into a filling port formed between the two cover plates. Through the filling port, a working fluid is filled into the vapor chamber and air inside the vapor chamber is drawn to the outside.

Conventionally, the sealing edges on the peripheries of the two covers are aligned with each other and then a connecting portion between the two covers is soldered together to thereby seal the edges of the vapor chamber. Further, the working fluid is filled into the vapor chamber. The working fluid circulates in the vapor chamber for transferring the heat by means of the phase change thereof. Since the interior of the vapor chamber is often subjected to thermal expansion and contraction, the tightness of the sealing edges of the vapor chamber becomes very critical. In order to enhance the tightness of the vapor chamber, the soldering process has to be performed more precisely, which inevitably increases the working hours and cost for manufacturing the vapor chamber.

In view of the above present, the present Inventor proposes a novel and reasonable method based on his experience and researches.

SUMMARY OF THE INVENTION

The present invention is to provide a method for sealing edges of a vapor chamber, whereby the tightness of sealing edges of the vapor chamber is enhanced.

The present invention is to provide a method for sealing edges of a vapor chamber, whereby the production yield is increased and the production cost is reduced.

The present invention provides a method for sealing edges of a vapor chamber, including steps of: (a) providing a first cover and a second cover, the first cover having its periphery bent to form a first folded edge, the second cover having its periphery bent to form a second folded edge; (b) providing a supporting structure and a wick structure between the first cover and the second cover; (c) covering the second cover on the first cover with the second folded edge being superposed on the first folded edge; (d) bending the first folded edge to cover on the second folded edge; and (e) providing a pressing die to press the first folded edge, thereby tightly connecting the first folded edge to the second folded edge.

In comparison with prior art, the present invention has the following advantageous features. According to the method of the present invention, the length of the first folded edge of the first cover is larger than that of the second folded edge of the second cover. When the second cover covers on the first cover, the first folded edge is bent to cover atop the second folded edge. Then, a pressing die is used to press the first folded edge and the second folded edge, thereby tightly connecting the first folded edge to the second edge. Since the connecting portion between the first cover and the second cover has an excellent tightness, the air or fluid received in the vapor chamber can be prevented from leaking to the outside through the connecting portion between the first folded edge and the second folded edge. Thus, it is unnecessary to perform a soldering process very precisely. The production yield of the present invention is increased while the production cost is reduced. Therefore, the present invention is practicable and cost-effective.

BRIEF DESCRIPTION OF DRAWING

FIG. 4 is an assembled cross-sectional view showing the method of the present invention;

FIG. 5 is an enlarged view of the portion A in FIG. 4;

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
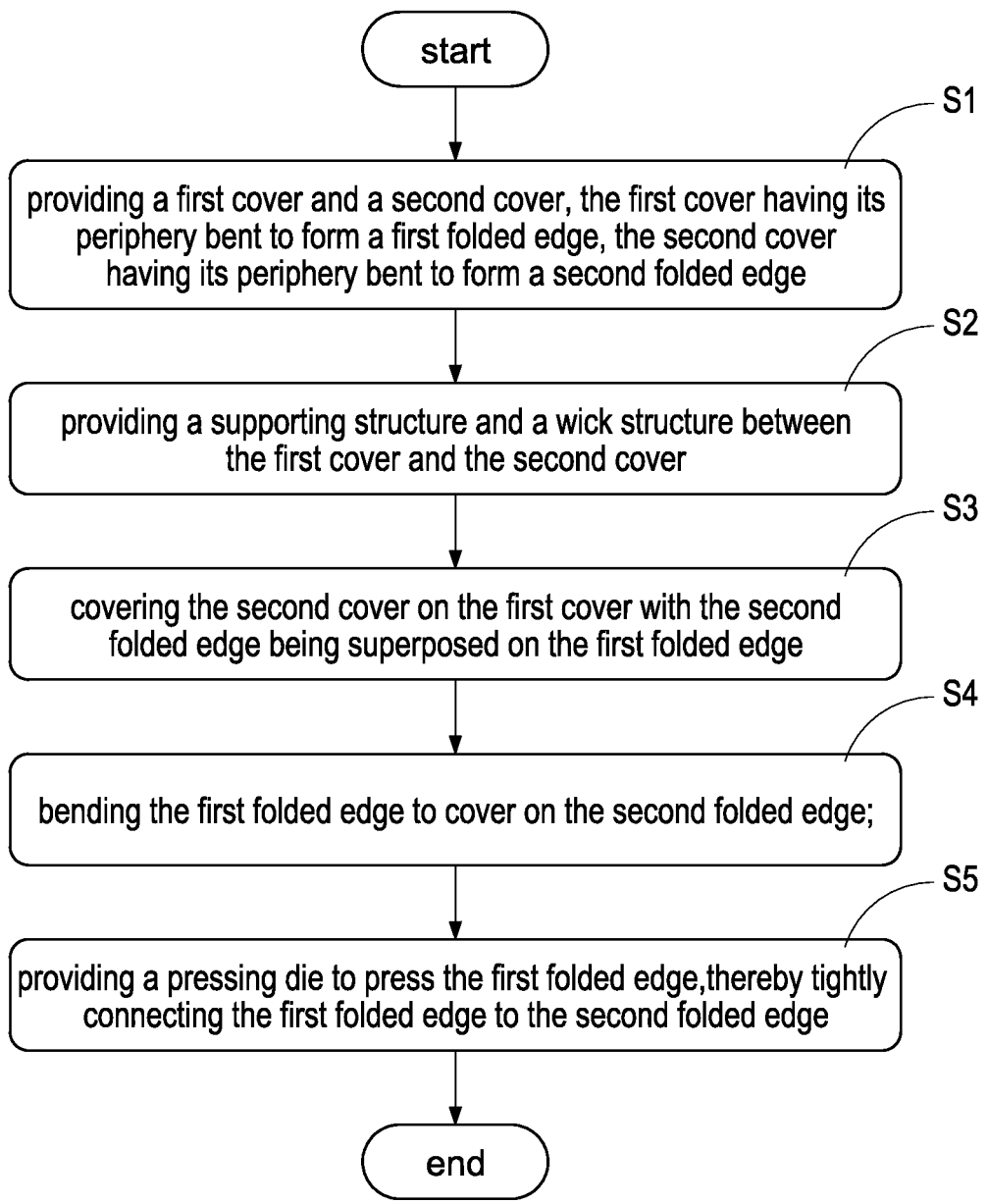
FIG. 1 is a flow chart showing the method for sealing edges of a vapor chamber according to the present invention.
Figure 2:
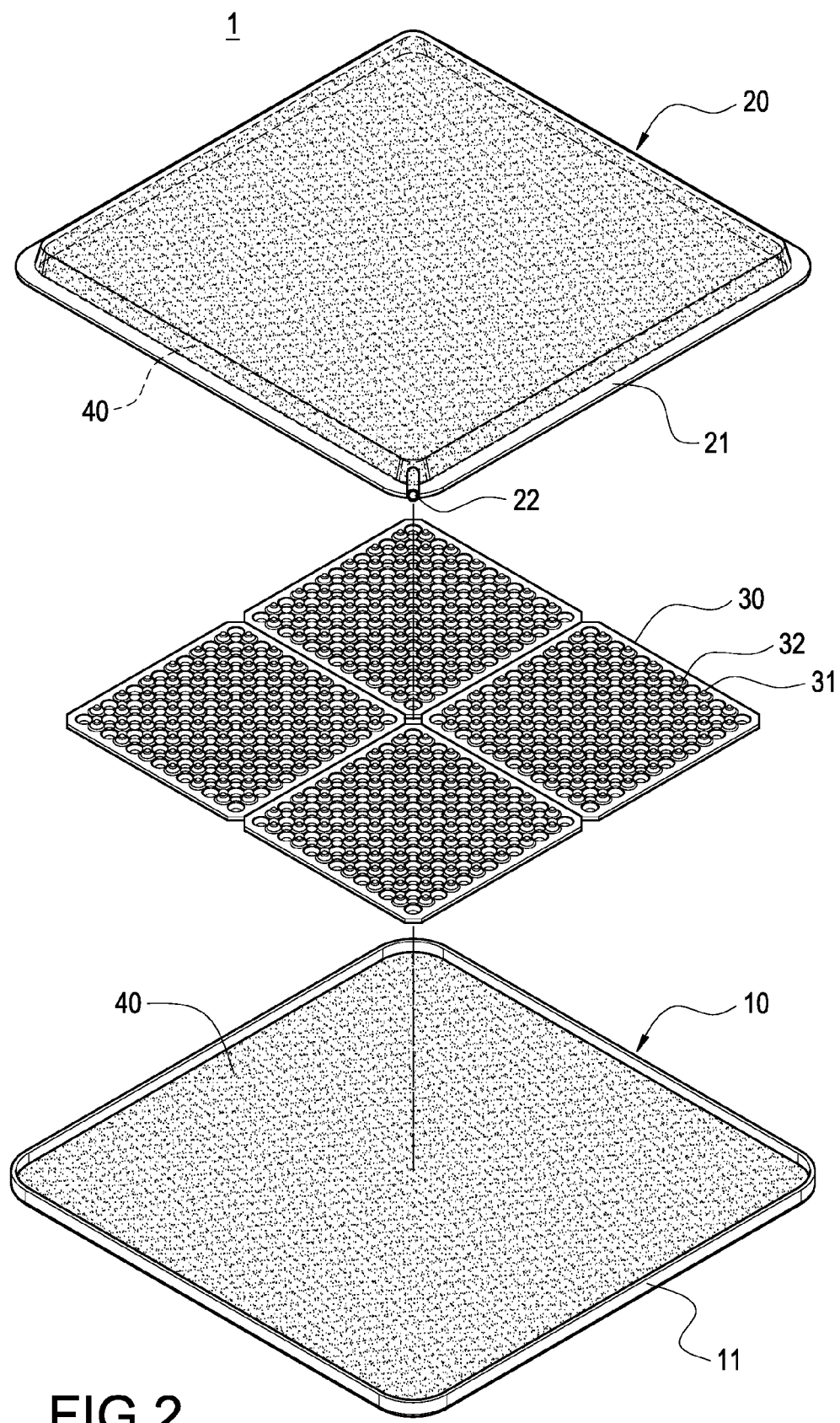
FIG. 2 is an exploded perspective view showing the method of the present invention.

Please refer to FIGS. 1 to 2. FIG. 1 is a flow chart showing the method for sealing edges of a vapor chamber according to the present invention, and FIG. 2 is an exploded perspective view showing the method of the present. First, in a step 51, a first cover 10 and a second cover 20 are provided. The periphery of the first cover 10 is bent to form a first folded edge 11. The periphery of the second cover 20 is also bent to form a second folded edge 21. The length of the first folded edge 11 is larger than that of the second folded edge 21. The second cover 20 has a sealing pipe 22. In the present embodiment, each of the first cover 10 and the second cover 20 is a square plate, but it is not limited thereto. In practice, the first cover 10 and the second cover 20 may be formed into other suitable shapes such as a circular plate.

Next, in a step S2, a supporting structure 30 and a wick structure 40 are provided between the first cover 10 and the second cover 20. The wick structure 40 is arranged inside the first cover 10 and the second cover 20. The supporting structure 30 is configured to support the wick structure 40 to thereby abut against inner walls of the first cover 10 and the second cover 20. In the present embodiment, the supporting structure 30 is formed into a plate on which a plurality of protrusions 31 and through-holes 32 are provided. The through-holes 32 are formed between the protrusions 31. A portion of the protrusions 31 protrude from one surface of the plate, and the other portion of the protrusions 31 protrude from the other surface of the plate.

Figure 3:
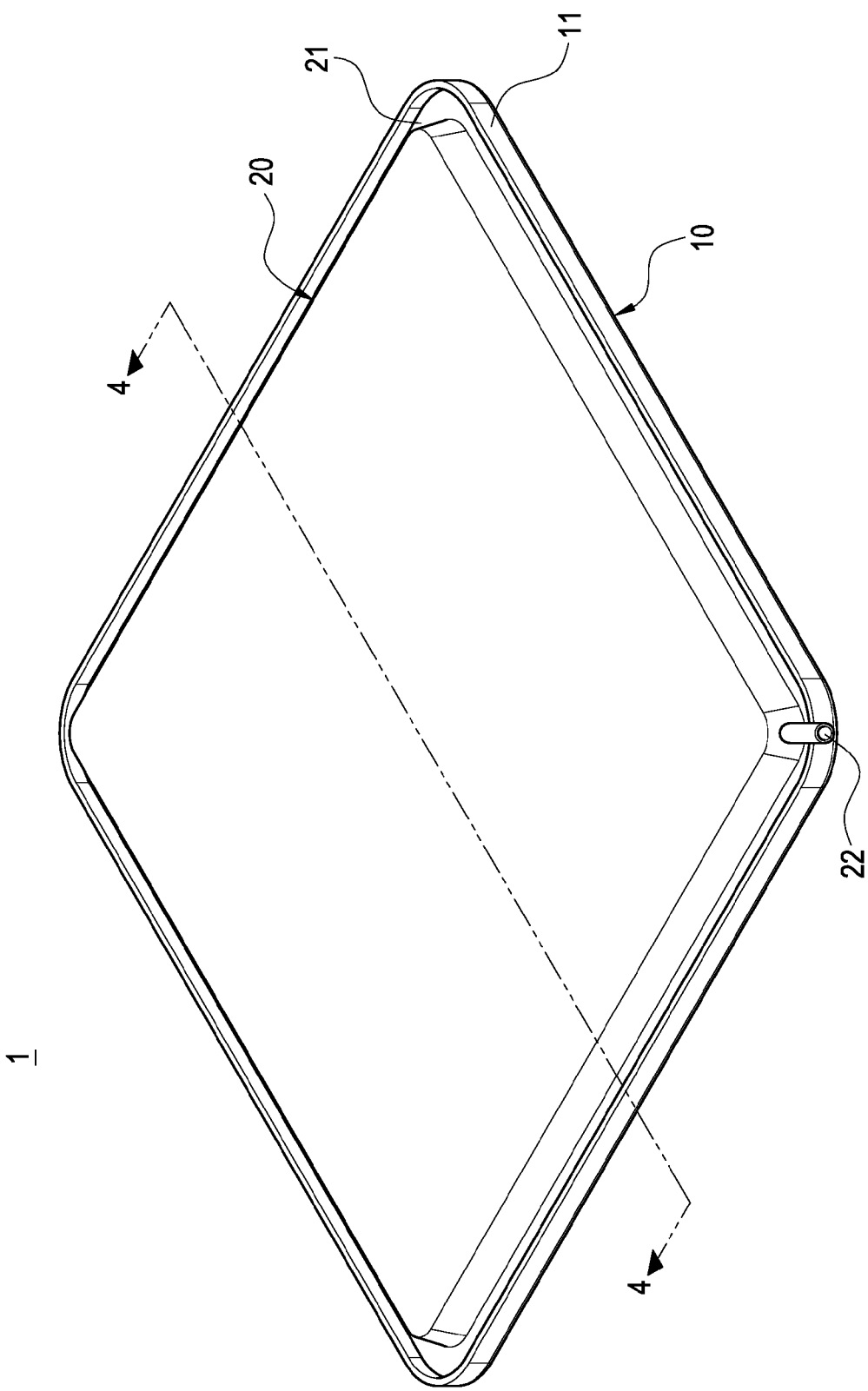
FIG. 3 is an assembled view showing the method of the present invention.

Please refer to FIGS. 3 to 5. FIG. 3 is an assembled view showing the method of the present invention. FIG. 4 is an assembled cross-sectional view showing the method of the present invention. FIG. 5 is an enlarged view of the portion A in FIG. 4. In a step S3, the second cover 20 covers on the first cover 10 to thereby form a hollow plate body. A sealing pipe 22 provided on the second cover 20 is in communication with the interior of the hollow plate body. At the same time, the second folded edge 21 of the second cover 20 is superposed on the first folded edge 11 of the first cover 20. A portion of the first folded edge 11 is bent to abut against the outside of the second folded edge 21.

Figure 6A:
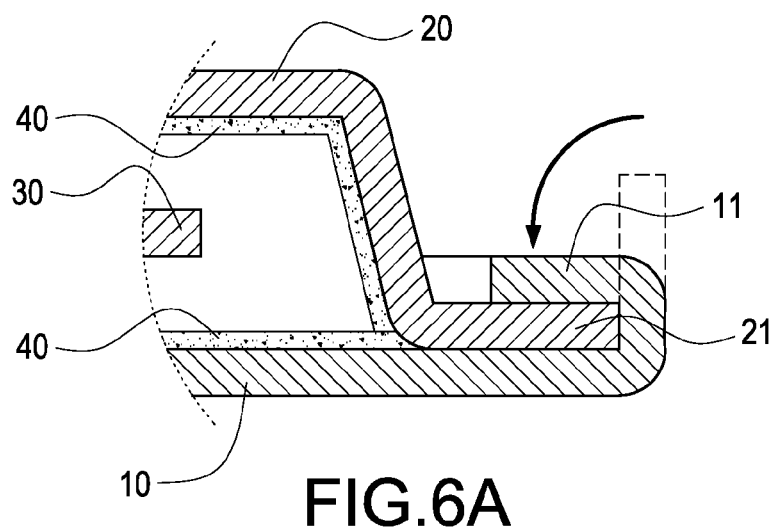
FIG. 6A is a schematic view (I) showing the sealing operation of the method according to the present invention.
Figure 6B:
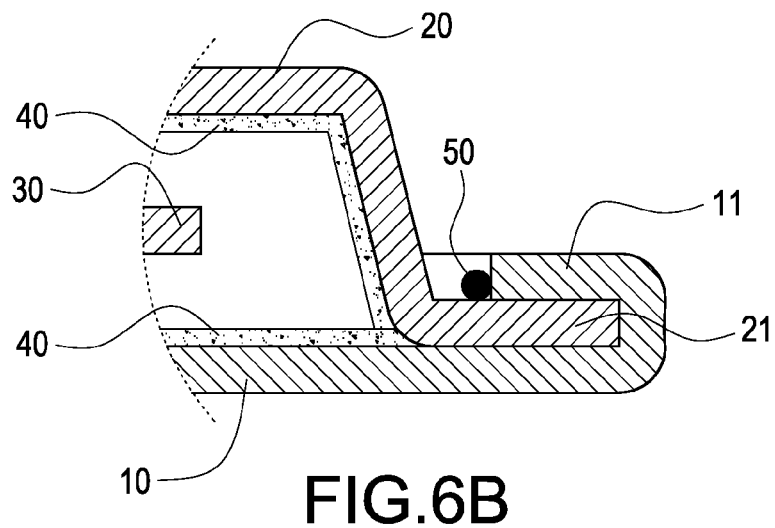
FIG. 6B is a schematic view (II) showing the sealing operation of the method according to the present invention.
Figure 6C:
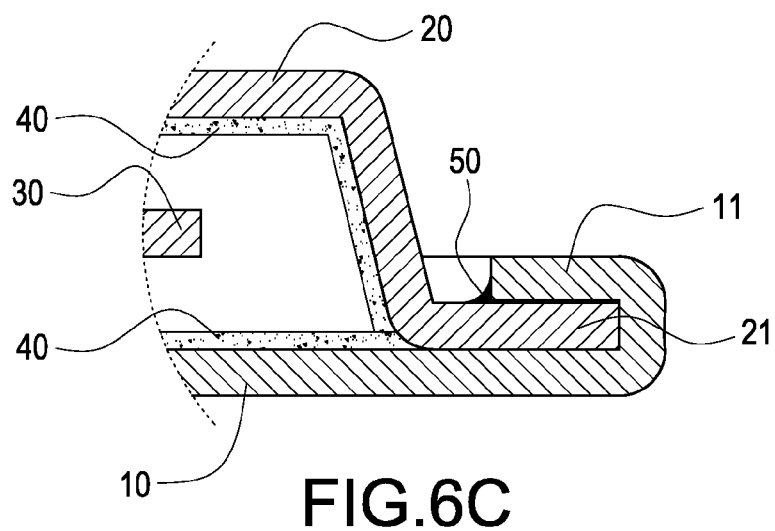
FIG. 6C is a schematic view (III) showing the sealing operation of the method according to the present invention.

Please refer to FIGS. 6A, 6B and 6C, which are views showing the sealing operation of the method according to the present invention respectively. In a step S4, the first folded edge 11 is bent to cover on the second folded edge 21. In a step S5, a pressing die (not show) is used to press the bent first folded edge 11, thereby tightly connecting the first folded edge 11 to the second folded edge 21. In order to enhance the tightness of a connecting portion between the first folded edge 11 and the second folded edge 21, a soldering material 50 is disposed in the connecting portion between the first folded edge 11 and the second folded edge 21. After the soldering material 50 is melted by a soldering process, the molten soldering material 50 is capable of connecting the first folded edge 11 and the second folded edge 21 tightly when it is cooled and hardened.

Figure 7:
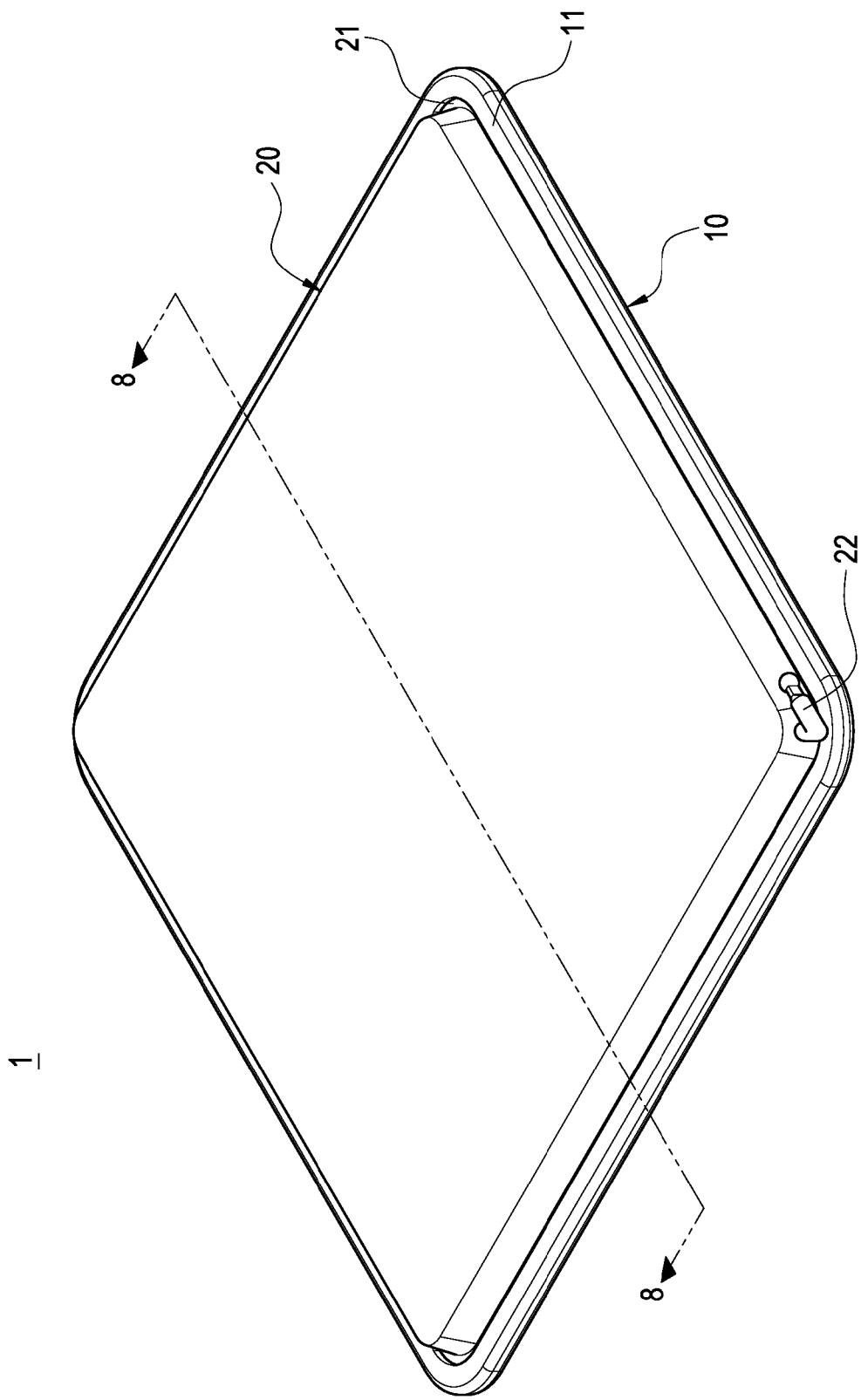
FIG. 7 is a perspective view showing the external appearance of the vapor chamber of the present invention.
Figure 8:
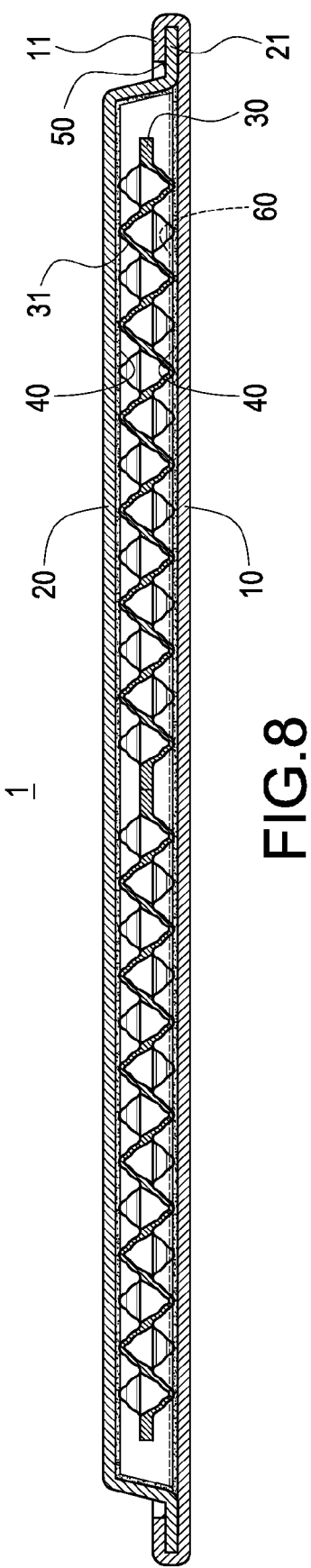
FIG. 8 is a cross-sectional view taken along the line 8-8 in FIG. 7.

Please refer to FIGS. 7 and 8. FIG. 7 is a perspective view showing the external appearance of the vapor chamber of the present invention. FIG. 8 is a cross-sectional view taken along the line 8-8 in FIG. 7. A working fluid 60 is filled into the hollow plate body through the sealing pipe 22. Then, a degassing processing and a pipe-sealing process are formed. In this way, the vapor chamber 1 of the present invention is formed completely.

Figure 9:
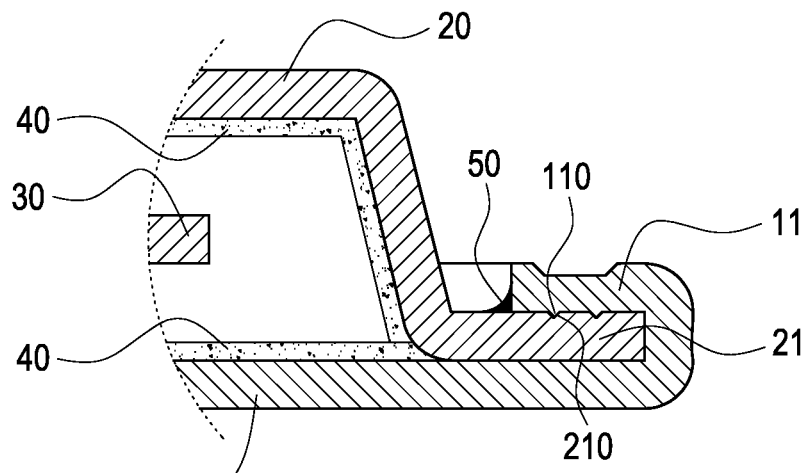
FIG. 9 is a schematic view showing a method for sealing edges of a vapor chamber according to a second embodiment of the present invention.
Figure 10:
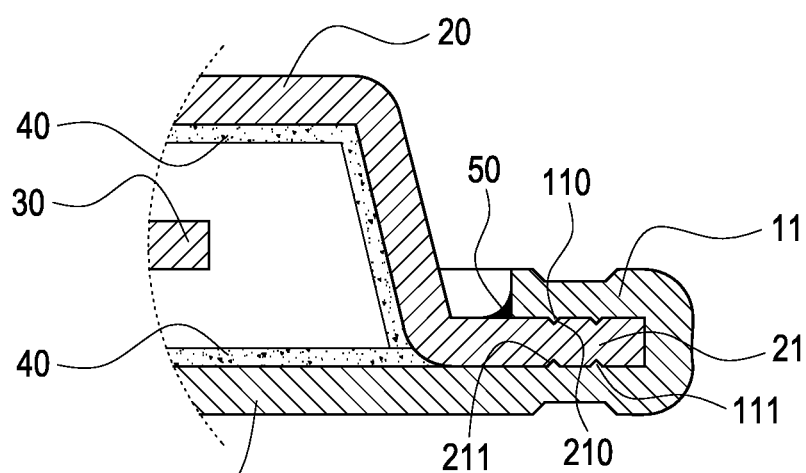
FIG. 10 is a schematic view showing a method for sealing edges of a vapor chamber according to a third embodiment of the present invention.

Please refer to FIGS. 9 and 10. FIG. 9 is a schematic view showing a method for sealing edges of a vapor chamber according to a second embodiment of the present invention. FIG. 10 is a schematic view showing a method for sealing edges of a vapor chamber according to a third embodiment of the present invention. The second embodiment is substantially the same as the first embodiment. The difference between the second embodiment and the first embodiment is as follows. As shown in FIG. 9, one side of the second folded edge 21 is provided with a recess 210. In the step S5, the pressing die is used to press the first folded edge 11, whereby the first folded edge 11 is formed with a protrusion 110 to correspond to the recess 210 of the second folded edge 21. With this arrangement, the first folded edge 11 can be engaged with the second folded edge 21 tightly. Further, as shown in FIG. 10, two opposite sides of the second folded edge 21 are respectively formed with a recess 210, 211. In the step S5, when the pressing die is used to press the first folded edge 11, both sides of the first folded edge 11 are respectively formed with a protrusion 110, 111 to correspond to the recess 210, 211 of the second folded edge 11. With this arrangement, the first folded edge 11 can be engaged with the second folded edge 21 tightly.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A method for sealing edges of a vapor chamber, including steps of:
(a) providing a first cover and a second cover, the first cover having its periphery bent to form a first folded edge, the second cover having its periphery bent to form a second folded edge;
(b) providing a supporting structure and a wick structure between the first cover and the second cover;
(c) covering the second cover on the first cover with the second folded edge being superposed on the first folded edge;
(d) bending the first folded edge to cover on the second folded edge; and
(e) providing a pressing die to press the first folded edge, thereby tightly connecting the first folded edge to the second folded edge,
wherein one side of the second folded edge is provided with a recess, the first folded edge is provided with a protrusion to correspond to the recess of the second folded edge after the pressing die is used to press the first folded edge in the step (e), whereby the first folded edge is tightly engaged with the second folded edge.

2. The method according to claim 1, wherein the length of the first folded edge is larger than that of the second folded edge.

3. The method according to claim 1, further including a step (f) of soldering a connecting portion between the first folded edge and the second folded edge.

4. A method for sealing edges of a vapor chamber, including steps of:
(a) providing a first cover and a second cover, the first cover having its periphery bent to form a first folded edge, the second cover having its periphery bent to form a second folded edge;
(b) providing a supporting structure and a wick structure between the first cover and the second cover;
(c) covering the second cover on the first cover with the second folded edge being superposed on the first folded edge;
(d) bending the first folded edge to cover on the second folded edge; and
(e) providing a pressing die to press the first folded edge, thereby tightly connecting the first folded edge to the second folded edge,
wherein two opposite sides of the second folded edge are respectively provided with a recess, two opposite sides of the first folded edge are respectively provided with a protrusion to correspond to the recesses of the second folded edge after the pressing die is used to press the first folded edge in the step (e), whereby the first folded edge is tightly engaged with the second folded edge.

5. The method according to claim 1, wherein the length of the first folded edge is larger than that of the second folded edge.

6. The method according to claim 1, further including a step (f) of soldering a connecting portion between the first folded edge and the second folded edge.

7. A method for sealing edges of a vapor chamber, including steps of:

(a) providing a first cover and a second cover, the first cover having its periphery bent to form a first folded edge, the second cover having its periphery bent to form a second folded edge;
(b) providing a supporting structure and a wick structure between the first cover and the second cover;
(c) covering the second cover on the first cover with the second folded edge being superposed on the first folded edge;
(d) bending the first folded edge to cover on the second folded edge;
(e) providing a pressing die to press the first folded edge, thereby tightly connecting the first folded edge to the second folded edge; and
(f) soldering a connecting portion between the first folded edge and the second folded edge.

8. The method according to claim 7, wherein the length of the first folded edge is larger than that of the second folded edge.

9. The method according to claim 7, wherein one side of the second folded edge is provided with a recess, the first folded edge is provided with a protrusion to correspond to the recess of the second folded edge after the pressing die is used to press the first folded edge in the step (e), whereby the first folded edge is tightly engaged with the second folded edge.

10. The method according to claim 7, wherein two opposite sides of the second folded edge are respectively provided with a recess, two opposite sides of the first folded edge are respectively provided with a protrusion to correspond to the recesses of the second folded edge after the pressing die is used to press the first folded edge in the step (e), whereby the first folded edge is tightly engaged with the second folded edge.

\* \* \* \* \*